(12) United States Patent
Borlick et al.

(10) Patent No.: US 9,858,148 B2
(45) Date of Patent: Jan. 2, 2018

(54) RAID DATA LOSS PREVENTION

(71) Applicant: International Business Machines Corporation, Armonk, NY (US)

(72) Inventors: Matthew G. Borlick, Tucson, AZ (US); Lokesh M. Gupta, Tucson, AZ (US); Clint A. Hardy, Tucson, AZ (US); Karl A. Nielsen, Tucson, AZ (US); Brian A. Rinaldi, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 14/948,330

(22) Filed: Nov. 22, 2015

(65) Prior Publication Data

US 2017/0147436 A1    May 25, 2017

(51) Int. Cl.
*G06F 11/10*        (2006.01)
*G06F 11/20*        (2006.01)
(Continued)

(52) U.S. Cl.
CPC ........ *G06F 11/1092* (2013.01); *G06F 3/0616* (2013.01); *G06F 3/0647* (2013.01);
(Continued)

(58) Field of Classification Search
CPC .. G06F 11/2094; G06F 11/008; G06F 3/0616; G06F 3/0679; G06F 11/1092;
(Continued)

(56) References Cited

U.S. PATENT DOCUMENTS 7,149,924 B1 * 12/2006 Zorian ................... G11C 29/16
                                                       714/30
7,434,090 B2 * 10/2008 Hartung .............. G06F 11/1092
                                                       714/6.2
(Continued)

FOREIGN PATENT DOCUMENTS

CN         102541704 A       7/2012

OTHER PUBLICATIONS

Larson, et al., "Virtual Hot Spare Disk Units", IP.com No. 000113515, Sep. 1994.
(Continued)

*Primary Examiner* — James C Kerveros
(74) *Attorney, Agent, or Firm* — Nelson and Nelson; Daniel P. Nelson; Alexis V. Nelson

(57) ABSTRACT

A method for preventing data loss in a RAID includes monitoring the age of storage drives making up a RAID. When a storage drive in the RAID reaches a specified age, the method individually tests the storage drive by subjecting the storage drive to a stress workload test. This stress workload test may be designed to place additional stress on the storage drive while refraining from adding stress to other storage drives in the RAID. In the event the storage drive fails the stress workload test (e.g., the storage drive cannot adequately handle the additional workload or generates errors in response to the additional workload), the method replaces the storage drive with a spare storage drive and rebuilds the RAID. In certain embodiments, the method tests the storage drive with greater frequency as the age of the storage drive increases. A corresponding system and computer program product are also disclosed.

17 Claims, 8 Drawing Sheets

(51) Int. Cl.

| | |
|---|---|
| *G06F 3/06* | (2006.01) |
| *G11C 29/00* | (2006.01) |
| *G11C 29/38* | (2006.01) |
| *G11C 29/40* | (2006.01) |
| *G11C 29/44* | (2006.01) |
| *G11C 29/46* | (2006.01) |
| *G11C 29/50* | (2006.01) |

(52) U.S. Cl.
CPC .......... *G06F 3/0659* (2013.01); *G06F 3/0689* (2013.01); *G06F 11/2094* (2013.01); *G11C 29/38* (2013.01); *G11C 29/40* (2013.01); *G11C 29/44* (2013.01); *G11C 29/4401* (2013.01); *G11C 29/46* (2013.01); *G11C 29/50016* (2013.01); *G11C 29/74* (2013.01); *G06F 11/1076* (2013.01); *G06F 11/1084* (2013.01); *G06F 11/1088* (2013.01); *G11C 2029/5002* (2013.01)

(58) Field of Classification Search
CPC ........ G06F 2212/7211; G06F 11/1076; G06F 3/0689; G06F 11/1084; G06F 11/1088
USPC ........................................................ 714/773
See application file for complete search history.

(56) References Cited

U.S. PATENT DOCUMENTS

| | | | | |
|---|---|---|---|---|
| 7,434,097 | B2* | 10/2008 | Guha .................... | G06F 11/008 714/6.32 |
| 7,502,964 | B2 | 3/2009 | del Rosario et al. | |
| 7,793,168 | B2 | 9/2010 | Hafner et al. | |
| 8,185,784 | B2* | 5/2012 | McCombs ........... | G06F 11/004 714/47.2 |
| 8,255,739 | B1* | 8/2012 | Chatterjee .......... | G06F 11/1084 714/6.1 |
| 8,386,709 | B2 | 2/2013 | Galloway et al. | |
| 8,756,486 | B2 | 6/2014 | LaBerge et al. | |
| 2005/0223164 | A1* | 10/2005 | Kitamura ................ | G06F 21/10 711/112 |
| 2006/0090098 | A1* | 4/2006 | Le ......................... | G06F 11/008 714/6.12 |
| 2006/0129761 | A1* | 6/2006 | Guha .................... | G06F 1/3221 711/114 |
| 2008/0126855 | A1* | 5/2008 | Higashijima ....... | G06F 11/0727 714/16 |
| 2011/0099320 | A1* | 4/2011 | Lucas .................. | G06F 3/0616 711/103 |
| 2014/0149787 | A1* | 5/2014 | Shanbhag ........... | G06F 11/1662 714/6.11 |
| 2014/0304548 | A1 | 10/2014 | Steffan et al. | |
| 2015/0046756 | A1 | 2/2015 | Sreekumaran et al. | |
| 2015/0186055 | A1* | 7/2015 | Darragh ................ | G06F 3/0616 711/103 |
| 2015/0186072 | A1* | 7/2015 | Darragh ................ | G06F 3/0653 711/103 |
| 2016/0154718 | A1* | 6/2016 | Chadwell ............ | G06F 11/1092 714/6.22 |
| 2016/0378628 | A1* | 12/2016 | Nguyen .............. | G06F 11/2236 714/40 |

OTHER PUBLICATIONS

IBM, "RAID Controller Peak Sustained Stress Test," IP.com No. 000015056, Jun. 2002.

IBM, "RAID Architecture with Variable Error Statistics in Sectors," IP.com No. 000014803, Jun. 2001.

Elerath, J. G., et al. "A Highly Accurate Method for Assessing Reliability of Redundant Arrays of Inexpensive Disks (RAID)", IEEE Transactions on Computers, vol. 58, No. 3, pp. 289-299, Mar. 2009.

* cited by examiner

400

$$\text{Frequency} = \text{MinFrequency} + \frac{(\text{MaxFrequency} - \text{MinFrequency})(\text{LifeExpectancy} - \text{CurrentAge})}{(\text{LifeExpectancy} - \text{MinAge})}$$

Fig. 4

Storage Drive
Selected for
Testing

RAID DATA LOSS PREVENTION

BACKGROUND

Field of the Invention

This invention relates to systems and methods for preventing data loss in Redundant Arrays of Independent Disks (RAIDs).

Background of the Invention

A RAID (i.e., a Redundant Array of Independent Disks) is a storage technology that provides increased storage functions and reliability through redundancy. A RAID is created by combining multiple storage drive components (disk drives and/or solid state drives) into a logical unit. Data is then distributed across the drives using various techniques, referred to as "RAID levels." The standard RAID levels, which currently include RAID levels 1 through 6, are a basic set of RAID configurations that employ striping, mirroring, and/or parity to provide data redundancy. Each of the configurations provides a balance between two key goals: (1) increasing data reliability and (2) increasing I/O performance.

When a storage drive component of a RAID fails, the RAID may be rebuilt to restore data redundancy. This may be accomplished by replacing the failed storage drive component with a standby storage drive component and copying and/or regenerating the lost data on the standby storage drive component. Ideally, the RAID will be rebuilt as expeditiously as possible to minimize the possibility that another storage drive component will fail during the rebuild and result in permanent data loss.

Unfortunately, when a RAID is being rebuilt due to a storage drive failure, additional stress is typically placed on the RAID that may cause other storage drives in the RAID to fail. This may be at least partially due to the fact that I/O may still be occurring on the RAID while it is being rebuilt. This may also be due to the fact that storage drives in a RAID may be of similar age, brand, size, etc., and when one storage drive fails, other storage drives may be on the verge of failing. The additional stress placed on the RAID during the rebuild process may be enough to induce these already-weakened drives to fail. Unfortunately, if another storage drive fails before the RAID has had a chance to rebuild, permanent data loss may occur.

In view of the foregoing, what are needed are systems and methods to prevent data loss in RAIDs. Ideally, such systems and methods will anticipate storage drive failures and proactively stress test storage drives and rebuild RAIDs before such failures occur. Further needed are systems and methods to intelligently rebuild a RAID array in a way that reduces the probability that another storage drive will fail during the RAID rebuild process.

SUMMARY

The invention has been developed in response to the present state of the art and, in particular, in response to the problems and needs in the art that have not yet been fully solved by currently available systems and methods. Accordingly, the invention has been developed to provide improved systems and methods to prevent data loss in Redundant Arrays of Independent Disks (RAIDs). The features and advantages of the invention will become more fully apparent from the following description and appended claims, or may be learned by practice of the invention as set forth hereinafter.

Consistent with the foregoing, a method for preventing data loss in a RAID is disclosed herein. In one embodiment, such a method includes monitoring the age of storage drives making up a RAID. When a storage drive in the RAID reaches a specified age, the method individually tests the storage drive by subjecting the storage drive to a stress workload test. This stress workload test may be designed to place additional stress on the storage drive while refraining from adding stress to other storage drives in the RAID during the testing process. In the event the storage drive fails the stress workload test (e.g., the storage drive cannot adequately handle the additional workload or generates errors in response to the additional workload), the method replaces the storage drive with a spare storage drive and rebuilds the RAID. In certain embodiments, the method tests the storage drive with greater frequency as the age of the storage drive increases.

A corresponding system and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 4 shows one example of an algorithm that may be used to determine how frequently a storage drive in a RAID is tested;

DETAILED DESCRIPTION

Figure 1:
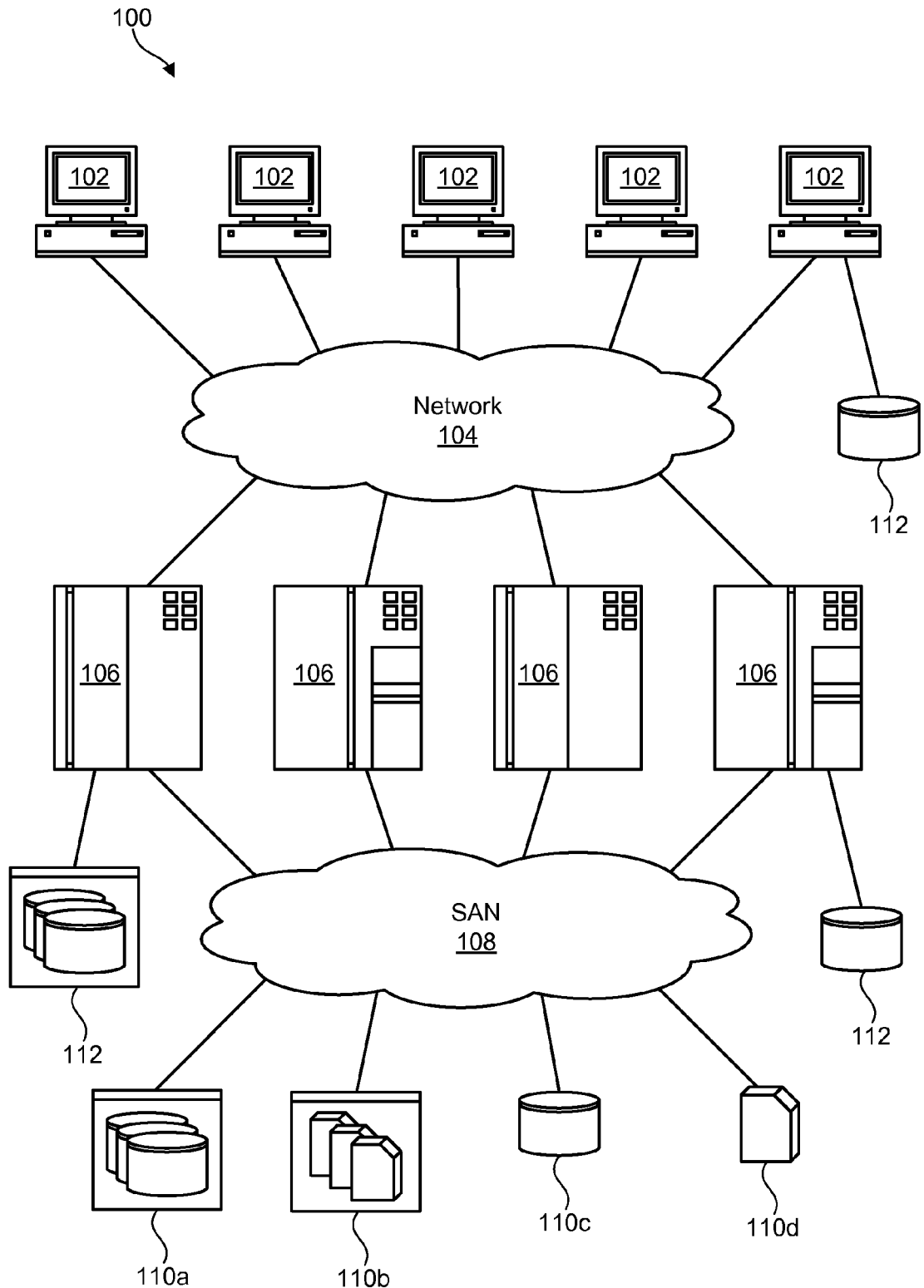
FIG. 1 is a high-level block diagram showing one example of an environment in which a system and method in accordance with the invention may operate.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The present invention may be embodied as a system, method, and/or computer program product. The computer program product may include a computer readable storage medium (or media) having computer readable program instructions thereon for causing a processor to carry out aspects of the present invention.

The computer readable storage medium may be a tangible device that can retain and store instructions for use by an instruction execution device. The computer readable storage medium may be, for example, but is not limited to, an electronic storage system, a magnetic storage system, an optical storage system, an electromagnetic storage system, a semiconductor storage system, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage system via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on a user's computer, partly on a user's computer, as a stand-alone software package, partly on a user's computer and partly on a remote computer, or entirely on a remote computer or server. In the latter scenario, a remote computer may be connected to a user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

Referring to FIG. 1, one example of a network architecture 100 is illustrated. The network architecture 100 is presented to show one example of an environment where embodiments of the invention may operate. The network architecture 100 is presented only by way of example and not limitation. Indeed, the apparatus and methods disclosed herein may be applicable to a wide variety of different network architectures in addition to the network architecture 100 shown.

As shown, the network architecture 100 includes one or more computers 102, 106 interconnected by a network 104. The network 104 may include, for example, a local-area-network (LAN) 104, a wide-area-network (WAN) 104, the Internet 104, an intranet 104, or the like. In certain embodiments, the computers 102, 106 may include both client computers 102 and server computers 106 (also referred to herein as "hosts" 106 or "host systems" 106). In general, the client computers 102 initiate communication sessions, whereas the server computers 106 wait for and respond to requests from the client computers 102. In certain embodiments, the computers 102 and/or servers 106 may connect to one or more internal or external direct-attached storage systems 112 (e.g., arrays of hard-storage drives, solid-state drives, tape drives, etc.). These computers 102, 106 and direct-attached storage systems 112 may communicate using protocols such as ATA, SATA, SCSI, SAS, Fibre Channel, or the like.

The network architecture 100 may, in certain embodiments, include a storage network 108 behind the servers 106, such as a storage-area-network (SAN) 108 or a LAN 108 (e.g., when using network-attached storage). This network 108 may connect the servers 106 to one or more storage systems 110, such as arrays 110a of hard-disk drives or solid-state drives, tape libraries 110b, individual hard-disk drives 110c or solid-state drives 110c, tape drives 110d, CD-ROM libraries, or the like. To access a storage system 110, a host system 106 may communicate over physical connections from one or more ports on the host 106 to one or more ports on the storage system 110. A connection may be through a switch, fabric, direct connection, or the like. In certain embodiments, the servers 106 and storage systems 110 may communicate using a networking standard such as Fibre Channel (FC) or iSCSI.

Figure 2:
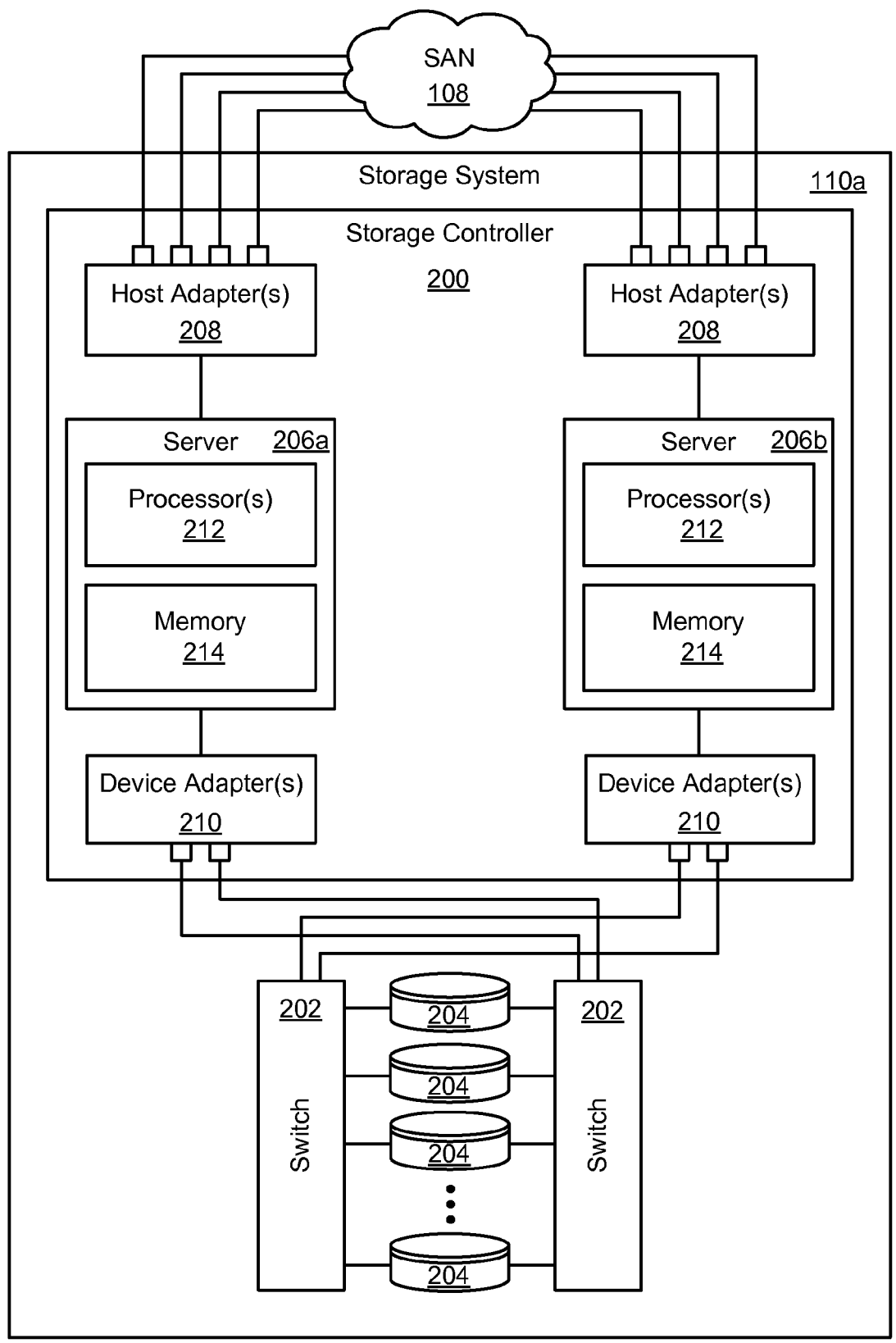
FIG. 2 is a high-level block diagram showing one embodiment of storage system that may implement a RAID.

Referring to FIG. 2, one example of a storage system 110a containing an array of hard-disk drives 204 and/or solid-state drives 204 is illustrated. The internal components of the storage system 110a are shown since the techniques disclosed herein may, in certain embodiments, be implemented within such a storage system 110a, although the techniques may also be applicable to other storage systems 110. As shown, the storage system 110a includes a storage controller 200, one or more switches 202, and one or more storage drives 204, such as hard-disk drives 204 and/or solid-state drives 204 (e.g., flash-memory-based drives 204). The storage controller 200 may enable one or more hosts 106 (e.g., open system and/or mainframe servers 106) to access data in the one or more storage drives 204.

In selected embodiments, the storage controller 200 includes one or more servers 206. The storage controller 200 may also include host adapters 208 and device adapters 210 to connect the storage controller 200 to host devices 106 and storage drives 204, respectively. Multiple servers 206a, 206b may provide redundancy to ensure that data is always available to connected hosts 106. Thus, when one server 206a fails, the other server 206b may pick up the I/O load of the failed server 206a to ensure that I/O is able to continue between the hosts 106 and the storage drives 204. This process may be referred to as a "failover."

In selected embodiments, each server 206 may include one or more processors 212 and memory 214. The memory 214 may include volatile memory (e.g., RAM) as well as non-volatile memory (e.g., ROM, EPROM, EEPROM, hard disks, flash memory, etc.). The volatile and non-volatile memory may, in certain embodiments, store software modules that run on the processor(s) 212 and are used to access data in the storage drives 204. The servers 206 may host at least one instance of these software modules. These software modules may manage all read and write requests to logical volumes in the storage drives 204.

One example of a storage system 110a having an architecture similar to that illustrated in FIG. 2 is the IBM DS8000™ enterprise storage system. The DS8000™ is a high-performance, high-capacity storage controller providing disk and solid-state storage that is designed to support continuous operations. Nevertheless, the methods disclosed herein are not limited to the IBM DS8000™ enterprise storage system 110a, but may be implemented in any comparable or analogous storage system 110, regardless of the manufacturer, product name, or components or component names associated with the system 110. Any storage system that could benefit from one or more embodiments of the invention is deemed to fall within the scope of the invention. Thus, the IBM DS8000™ is presented only by way of example and not limitation.

Figure 3:
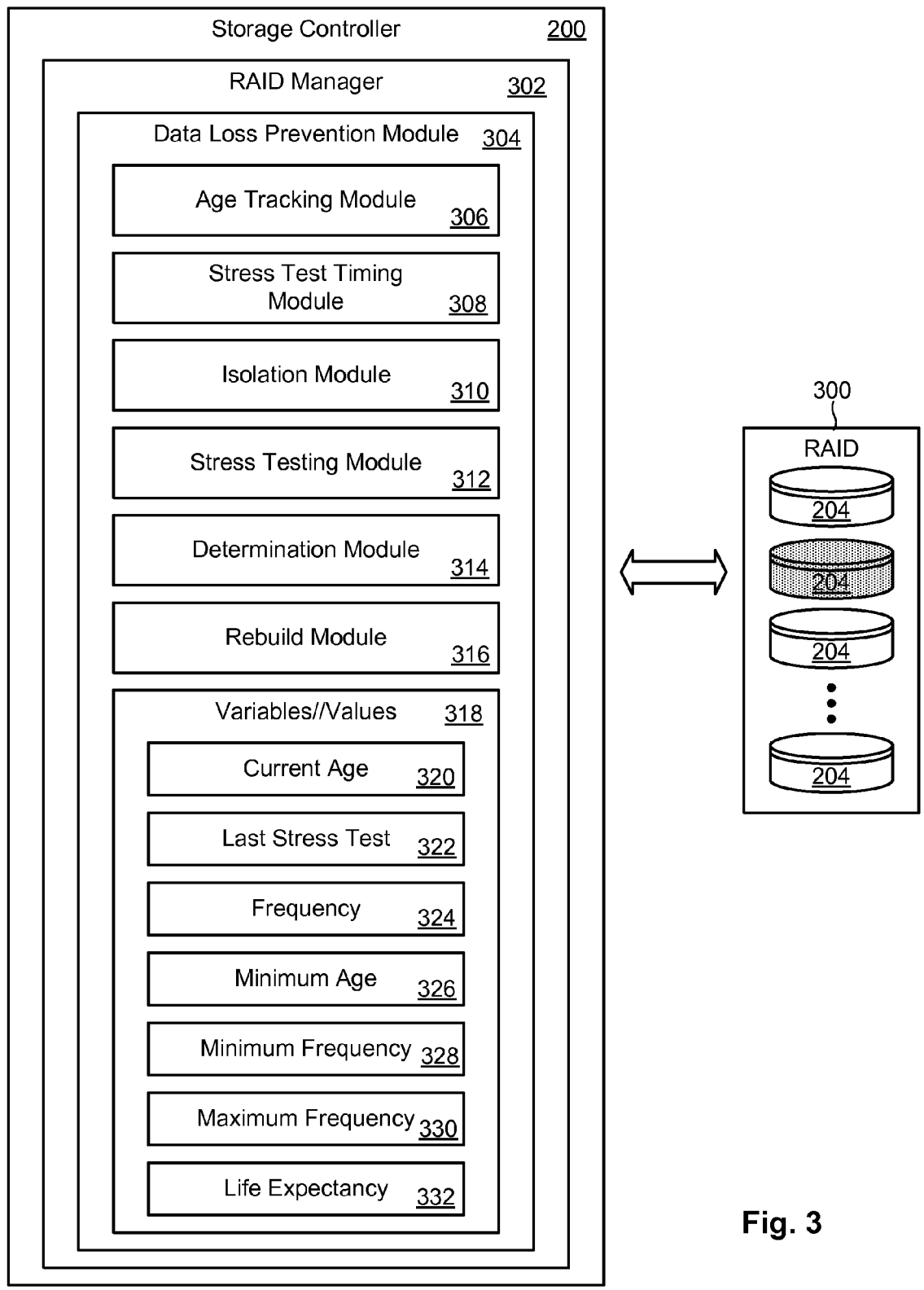
FIG. 3 is a high-level block diagram showing one embodiment of a data loss prevention module in accordance with the invention.

Referring to FIG. 3, while continuing to refer generally to FIG. 2, in certain embodiments, hard-disk drives 204 and/or solid-state drives 204 in the storage system 110 may be organized in a RAID 300 to provide a desired level of redundancy and/or performance. Any of various RAID levels may be used. A RAID manager 302 may manage the hard-disk drives 204 and/or solid-state drives 204 and present the storage drives 204 as a single logical unit or virtual storage device that can be read from or written to. Applications or devices that write to the RAID 300 may be unaware of the actual physical configuration of storage drives 204 behind the RAID manager 302. The RAID manager 302 may handle operations behind the covers and provide storage virtualization functions such as distributing (e.g., striping) data across the storage drives 204 and/or reading data from the storage drives 204 in response to I/O to the RAID 300.

In certain embodiments, the RAID manager 302 may be equipped with a data loss prevention module 304 in accordance with the invention to anticipate storage drive failures and take proactive remedial measures to prevent data loss in the RAID 300. In general, the data loss prevention module 304 may accomplish this by monitoring the age of storage drives 204 in the RAID 300 and individually subjecting the storage drives 204 to stress workload tests to determine if the storage drives 204 are on the verge of failing. If a storage drive 204 fails a stress workload test, the data loss prevention module 304 may replace the storage drive 204 with a new storage drive 204 and rebuild the RAID 300. In certain embodiments, various smart rebuild methodologies may be used to rebuild the RAID 300 to prevent or minimize stress that is placed on other storage drives 204 in the RAID 300. This will ideally reduce the chance that another storage drive 204 in the RAID 300 will fail during the rebuild process and thereby result in permanent data loss.

To provide the functionality described above, the data loss prevention module 304 may include one or more sub-modules to perform various functions, as well as maintain various variables/values 318. The sub-modules may, in certain embodiments, include one or more of an age tracking module 306, stress-test timing module 308, isolation module 310, stress testing module 312, determination module 314, and rebuild module 316. The variables/values 318 may include one or more of a current age value 320, last stress test value 322, frequency value 324, minimum age value 326, minimum frequency value 328, maximum frequency value 330, and life expectancy value 332. Some of the variables/values 318 may be maintained for a RAID 300 as a whole whereas others may be maintained for each individual storage drive 204 in the RAID 300.

The age tracking module 306 may be configured to track the age of storage drives 204 in the RAID 300. The age tracking module 306 may track the current age 320 of a storage drive 204 as a raw number or as a percentage of the drive's life expectancy 332, such as a life expectancy 332 published by a vendor of the storage drive 204. When the current age 320 of a storage drive 204 reaches a specified amount or a specified percentage of its life expectancy 332, the age tracking module 306 may initiate stress testing operations on a storage drive 204 in order to anticipate when the storage drive 204 may fail.

Once the current age 320 of a storage drive 204 reaches a specified age or a specified percentage of the drive's life expectancy 332, a stress-test timing module 308 in accordance with the invention may determine if and when to test the storage drive 204. In certain embodiments, a storage drive 204 more be tested more frequently as it ages. Thus, the stress-test timing module 308 may in certain embodiments calculate and recalculate a frequency value 324 for testing the storage drive 204 as the storage drive 204 ages. One embodiment of an algorithm 400 that may be used by the stress-test timing module 308 to calculate the frequency 324 is illustrated in FIG. 4.

As shown in FIG. 4, a frequency 324 for testing a storage drive 204 may, in certain embodiments, be a function of a minimum frequency 328, maximum frequency 334, life expectancy 332, current age 320, and minimum age 326. The minimum age 326 may designate a minimum age (e.g., fifty percent of the life expectancy 332) to begin testing a storage drive 204. The minimum frequency 328 may designate a minimum frequency (e.g., seven days, etc.) to test the storage drive 204 once the storage drive 204 has reached the minimum age 326. The maximum frequency 330 may designate a maximum frequency (e.g., thirty days) to test the storage drive 204 after testing has started. In general, using the algorithm 400, once a storage drive 204 has reached the minimum age 326 to begin testing, the frequency 324 for testing a storage drive 204 will begin at the maximum frequency value 330 and then gradually increase to the minimum frequency value 328 as the storage drive 204 ages. After the storage drive 204 has reached its life expectancy 332, the frequency 324 for testing the storage drive 204 will remain at the minimum frequency 328 so as not to over test the storage drive 204. The manner in which the stress-test timing module 308 may determine the actual timing for testing a storage drive 204 will be discussed in association with FIG. 5.

When the stress-test timing module 308 determines that it is time to test a storage drive 204, an isolation module 310 may isolate the storage drive 204 within the RAID 300 for testing. When testing a storage drive 204, the isolation module 310 may ensure that additional workload stress is placed only on the storage drive 204 that is being tested as opposed to other storage drives 204 in the RAID 300. This will reduce the probability that other storage drives 204 in the RAID 300 will fail as a result of the test. In order to isolate the storage drive 204 being tested, the isolation module 310 may have knowledge of the drive configuration behind the RAID manager 302.

Once a storage drive 204 to be tested is isolated by the isolation module 310, the stress testing module 312 may test the storage drive 204. Testing the storage drive 204 may include placing additional workload stress on the storage drive 204, such as by placing an additional I/O workload (e.g., additional read workload) on the storage drive 204. In certain embodiments, the stress testing module 312 stresses the storage drive 204 within the drive's specification but above what the storage drive 204 would experience during normal operation. This elevated workload testing is intended to induce errors (e.g., media errors, etc.) that might not otherwise occur under normal stress levels, thereby alerting the data loss prevention module 304 that the storage drive 204 may be nearing failure. This will ideally allow a RAID rebuild process to be initiated before the storage drive 204 actually fails.

In certain embodiments, the stress workload test places a storage drive 204 selected for testing in a RAID 1 configuration with another good spare storage drive 204. This will cause an elevated number of reads to the storage drive 204 under test as data is mirrored from the storage drive 204 to the spare storage drive 204. If the storage drive 204 under test cannot handle the elevated number of reads or generates errors (thereby failing the stress workload test), data may continue to be mirrored (i.e., copied) from the failing storage drive 204 to the spare storage drive 204 as part of a RAID rebuild process. This may save a significant amount of time when rebuilding a RAID. Thus, creation of a RAID 1 array may function not only as a stress workload test but also as a smart rebuild methodology in the event the stress workload test is failed. The manner in which this may be performed will be discussed in association with FIGS. 6 through 11.

The determination module 314 may be configured determine if a storage drive 204 fails a workload stress test. In certain embodiments, failure may determined by a number of errors detected, severity of errors detected, type of errors detected, or a combination thereof. In the event a storage drive 204 is deemed to have failed a stress workload test, the rebuild module 316 may be invoked to rebuild the RAID 300. In one embodiment, the rebuild module 316 may rebuild the RAID 300 by replacing the failing storage drive 204 with a new storage drive 204 and then rebuilding the data on the new storage drive 204 using the data and parity values on the other storage drives 204. In other embodiments, the rebuild module 316 may use a smarter rebuild methodology that reduces stress on other storage drives 204 in the RAID 300. For example, data may be copied from the failing storage drive 204 to a new storage drive 204 before the storage drive 204 that is predicated to fail actually fails. The other storage drives 204 in the RAID 300 may be used solely to reconstruct data in sectors that cannot be recovered from the failing storage drive 204. One example of such a smart rebuild methodology will be discussed in association with FIGS. 6 through 11. Other smart rebuild methodologies may be used and are within the scope of the present invention. In general, a smart rebuild methodology may reduce the chance that a RAID rebuild process itself (and the additional stress it imposes) will induce other storage drives 204 in the RAID 300 to fail, possibly before the rebuild process has had a chance to complete.

Figure 5:
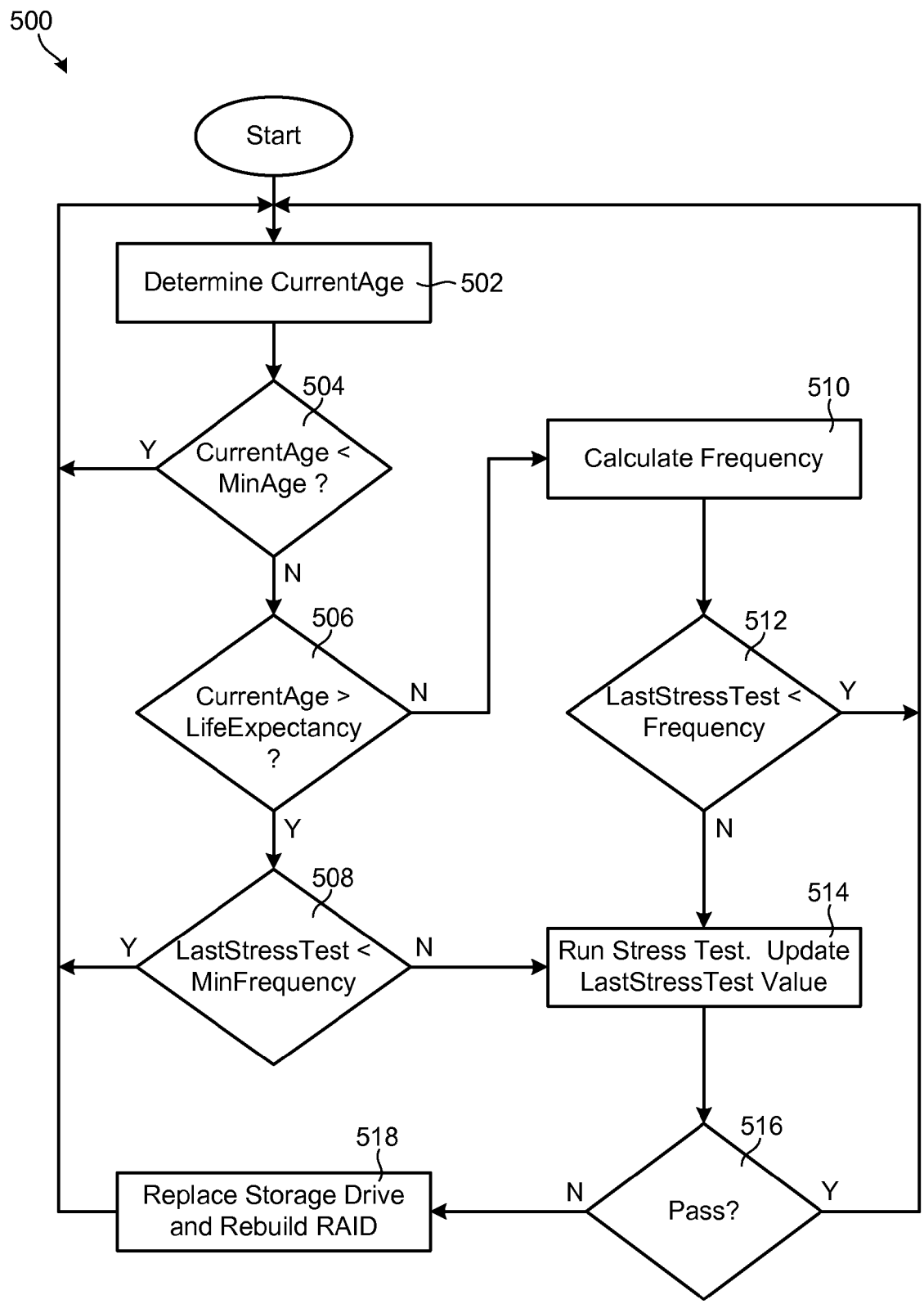
FIG. 5 is a flow diagram showing one embodiment of a method for preventing data loss in RAIDs.

Referring to FIG. 5, one embodiment of a method 500 that may be executed by a data loss prevention module 304 in accordance with the invention is illustrated. In certain embodiments, such a method 500 may be executed periodically (e.g., once a day, once a week, etc.) for each storage drive 204 in a RAID 300. As shown, the method 500 initially determines 502 the current age 320 of a storage drive 204 being examined. If, at step 504, the current age 320 of the storage drive 204 is less than a minimum age 326, the method 500 ends (i.e., no testing is needed). If, on the other hand, the current age 320 is greater than the minimum age 326, the method 500 determines 506 whether the current age 320 of the storage drive 204 is greater than the drive's life expectancy 332.

If the current age 320 of the storage drive 204 is greater than the drive's life expectancy 332, the method 500 determines 508 whether the last stress test that was performed on the storage drive 204 was less than the minimum frequency 328. For example, if the minimum frequency 328 is seven days and the last stress test was performed five days ago, then the decision step 508 would evaluate as true and the method 500 would end (i.e., no testing is needed). On the other hand, if the minimum frequency 328 is seven days and the last stress test was performed eight days ago, the decision step 508 would evaluate as false. In such a case, the method 500 would run 514 the stress workload test on the storage drive 204 and update 614 the drive's last stress test value 322 to reflect the timing of the test.

If, at decision step 506, the current age 320 of the storage drive 204 is less than the drives life expectancy 332, the method 500 calculates 510 a frequency 324 for testing the storage drive 204, such as using the algorithm illustrated in FIG. 4. The method 500 then determines 512 whether the last stress test that was performed is less than the frequency 324. For example, if the frequency 324 is calculated to be ten days (a value between the minimum frequency 328 and maximum frequency 330) but the last stress test was performed eight days ago, then the decision step 512 would evaluate as true and the method 500 would end (i.e., no testing needed). On the other hand, if the frequency 324 is calculated to be ten days and the last stress test was performed twelve days ago, then the decision step 512 would evaluate as false and the method 500 would run 514 the stress workload test and update 514 the drive's last stress test value 322.

If, at step 516, a storage drive 204 passes a stress workload test, the method 500 ends. If, on the other hand, the storage drive 204 fails the stress workload test, the method 500 replaces the storage drive 204 and rebuilds 518 with RAID 300 with a new storage drive 204. When rebuilding a RAID 300, the method 500 may discontinue testing on other storage drives 204 in the RAID 300 so as not to overburden these storage drives 204 and possibly cause additional failures. Once a RAID 300 is rebuilt, the method 500 may once again be resumed for the storage drives 204 of the RAID 300.

Figure 6:
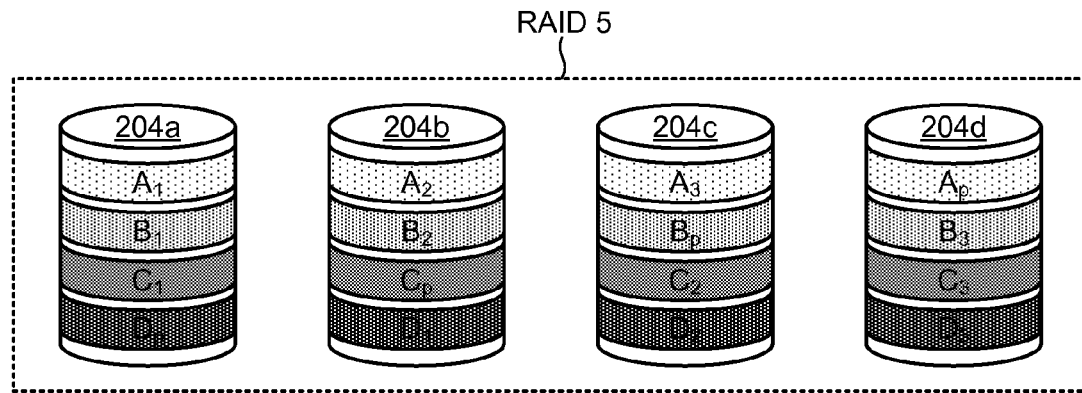
FIG. 6 shows one example of a RAID, namely a RAID 5 array.

Referring to FIGS. 6 through 11, one example of a stress workload test and/or smart rebuild methodology in accordance with the invention is illustrated. The stress workload test and/or smart rebuild methodology is presented by way of example and is not intended to be limiting. FIG. 6 shows one embodiment of a RAID array, in this example a RAID 5 array with four storage drives 204*a-d*. The RAID 5 array is configured to use block-level striping with parity values that are distributed across the drives 204*a-d*. The RAID 5 array may continue to operate with all drives 204*a-d* except one. Upon failure of a single drive 204 in the RAID 5 array, subsequent reads to the array may be serviced using the distributed parity, thereby making all data available. The RAID 5 array's distributed parity allows stress to be distributed across all RAID members 204*a-d*. Additionally, read performance may be improved since all RAID members 204*a-d* may participate in read requests.

Figure 7:
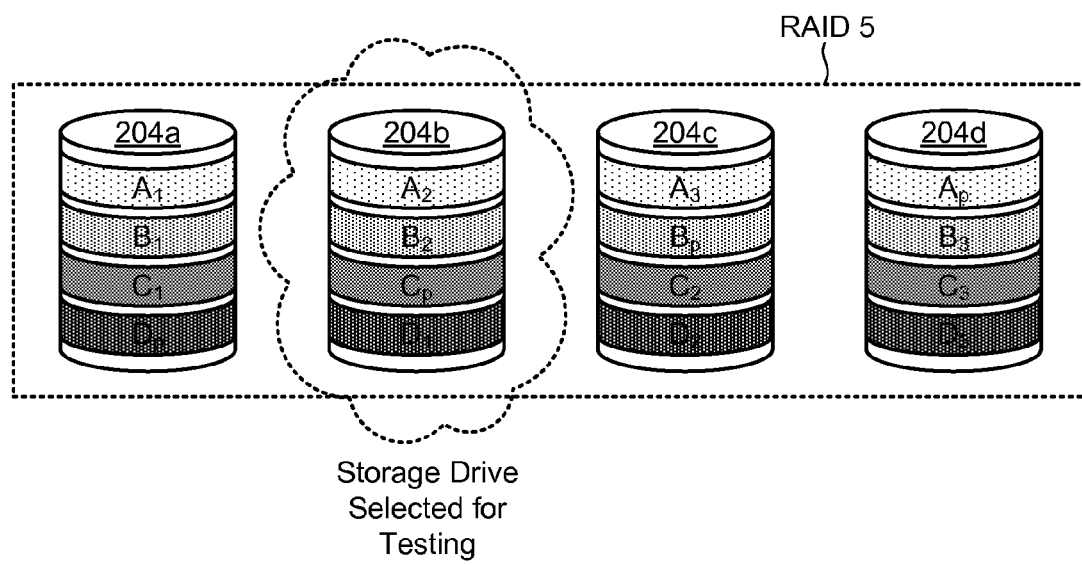
FIG. 7 shows a scenario where a storage drive within the RAID of FIG. 6 is selected for testing.
Figure 8:
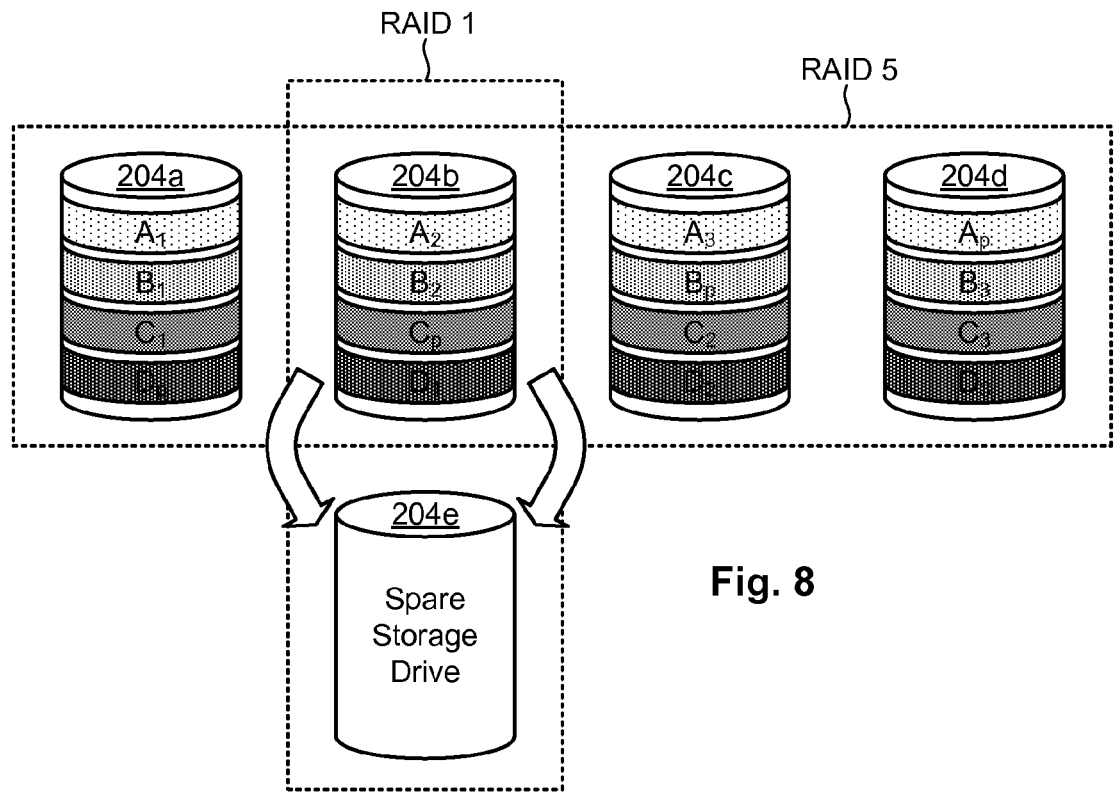
FIG. 8 shows a stress workload test and/or smart rebuild methodology wherein a spare storage drive is brought in to create a RAID 1 array with the storage drive selected for testing.
Figure 9:
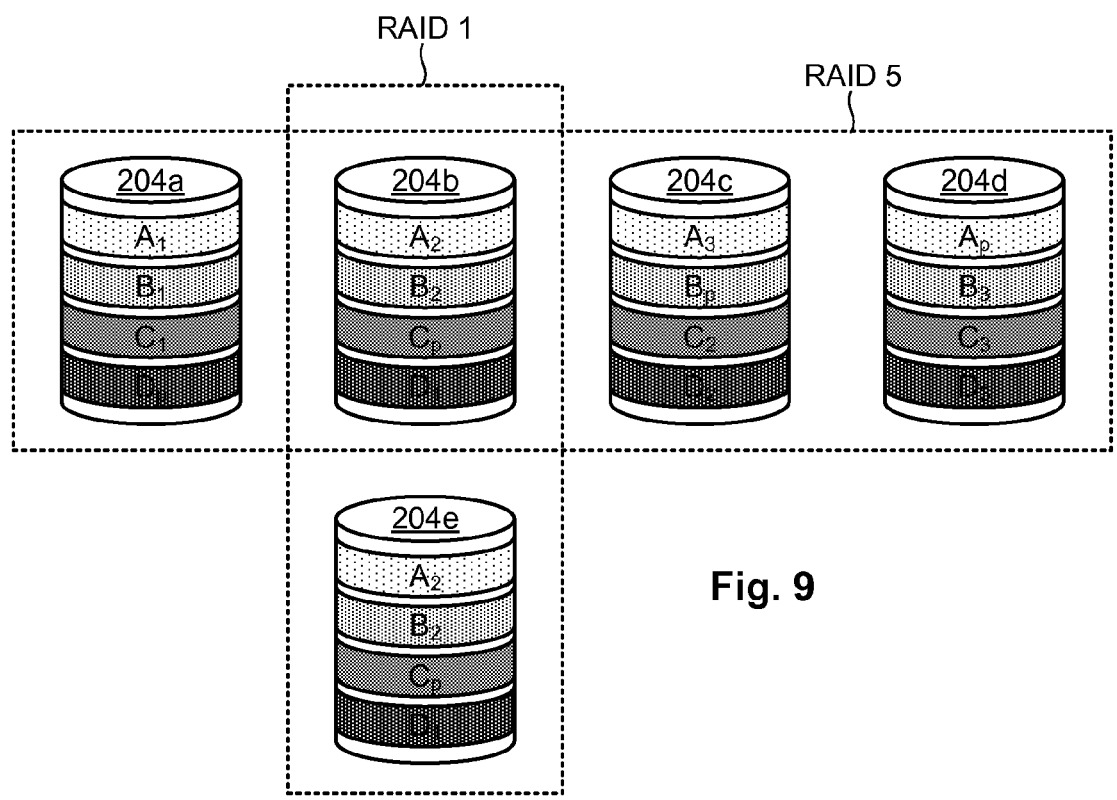
FIG. 9 shows mirroring of data from the failing storage drive to the spare storage drive.

Assume that a storage drive 204*b* in the RAID 5 array is selected for testing, as shown in FIG. 7. To perform the stress workload test, a spare storage drive 204*e* may be brought in to create a RAID 1 array with the storage drive 204*b*, as shown in FIG. 8. The creation of the RAID 1 array will mirror data from the storage drive 204*b* to the spare storage drive 204*e* (thereby initiating the process to create two exact copies of all data that is recoverable on the storage drive 204*b*), as shown in FIG. 9. During the stress workload test, the storage drive 204*b* may continue to service I/O requests to the RAID 5 array along with the other storage drives 204*a*, 204*c*, 204*d*.

If the storage drive 204*b* under test is able to handle the additional reads caused by creation of the RAID 1 array, the test may end and the storage drive 204*b* may remain in service in the RAID 5 array. If, on the other hand, the storage drive 204*b* under test is not able to handle the additional reads and/or the storage drive 204*b* generates too many errors (i.e., the storage drive 204*b* is deemed to be a "failing" storage drive 204*b*), the data mirroring process may continue to copy all recoverable data from the failing storage drive 204*b* to the spare storage drive 204*e*. In this scenario, the stress workload test may transition to a smart rebuild methodology.

Figure 10:
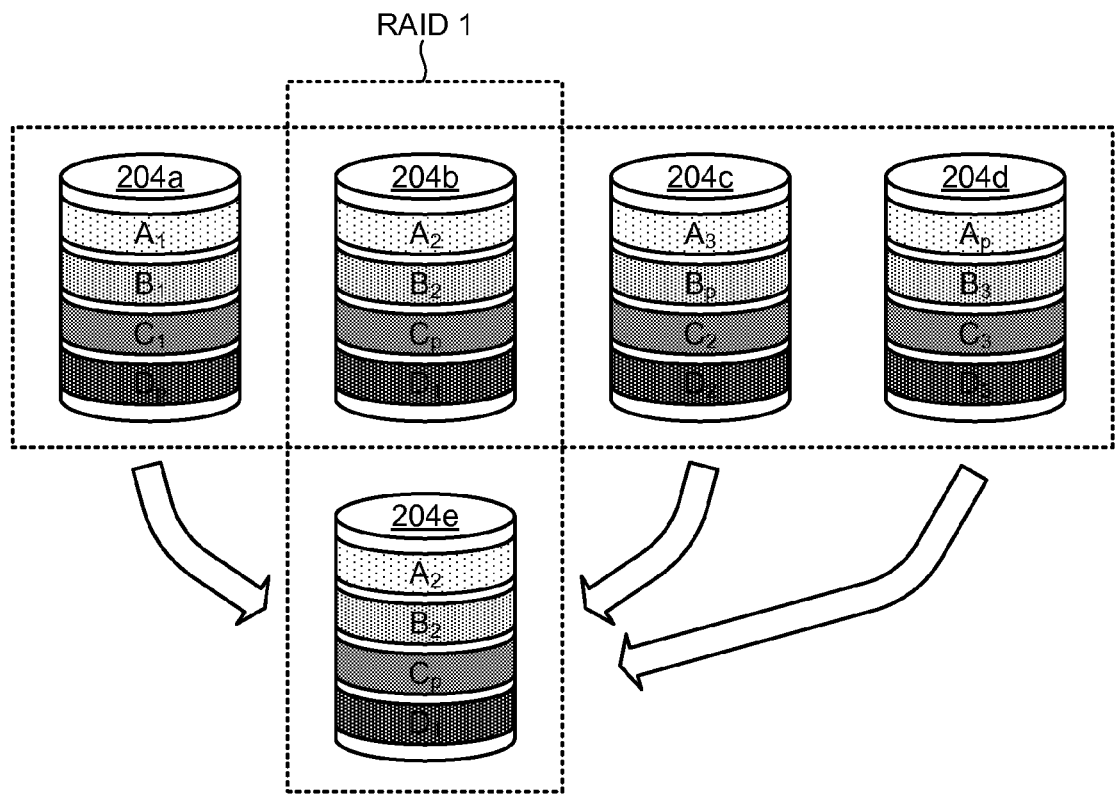
FIG. 10 shows use of other storage drives in the RAID 5 array to reconstruct, on the spare storage drive, data that is not recoverable on the failing storage drive.
Figure 11:
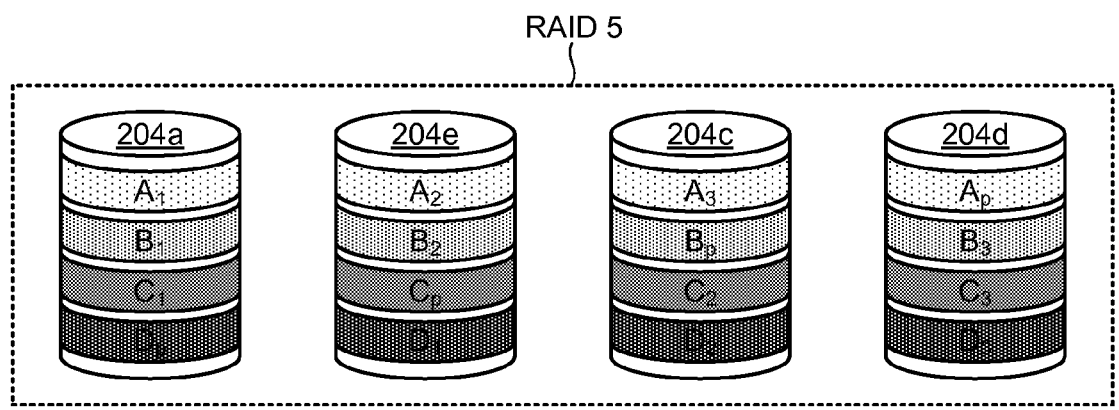
FIG. 11 shows the RAID 5 array after the smart rebuild methodology has completed.

For all data that is not recoverable on the failing storage drive 204*b* (due to media errors or other defects, for example), the smart rebuild methodology may reconstruct the data on the spare storage drive 204*e* using the data and parity values on the other storage drives 204*a*, 204*c*, 204*d* of the RAID 5 array, as shown in FIG. 10. This will ensure that the spare storage drive 204*e* contains a complete copy of data that should be stored on the failing storage drive 204*b*. The failing storage drive 204*b* may then be logically replaced with the spare storage drive 204*e* in the RAID 5 array, as shown in FIG. 11, and the RAID 1 mirroring relationship between the failing storage drive 204*b* and the spare storage drive 204*e* may be terminated. This will allow the failing storage drive 204*b* to be physically removed from a storage system 110 and optionally replaced with another good spare storage drive.

The timing for logically replacing the failing storage drive 204*b* with the spare storage drive 204*e* in the RAID 5 array may vary in different embodiments. In some embodiments, the failing storage drive 204*b* is logically replaced with the spare storage drive 204*e* after all data has been mirrored/reconstructed on the spare storage drive 204*e*. In other embodiments, the failing storage drive 204*b* is logically replaced with the spare storage drive 204*e* after recoverable data from the failing storage drive 204*b* is mirrored to the spare storage drive 204*e*, but before unrecoverable data on the failing storage drive 204*b* is reconstructed on the spare storage drive 204*e*.

In yet other embodiments, some I/O of the RAID 5 array may be directed to the spare storage drive 204*e* before data has been completely mirrored and/or reconstructed on the spare storage drive 204*e*, while other I/O is directed to the failing storage drive 204*b* or to the other storage drives 204*a*, 204*c*, 204*c* in the RAID 5 array. For example, reads may be directed to the spare storage drive 204*e* for data that has been mirrored or reconstructed on the spare storage drive 204*e*, while other reads may be directed to the failing storage drive 204*b* for data that has not yet been mirrored, or to the other storage drives 204*a*, 204*c*, 204*d* for data that is unrecoverable on the failing storage drive 204*b* but not yet reconstructed on the spare storage drive 204*e*. Writes, on the other hand, may, in certain embodiments, be directed to the spare storage drive 204*e* (thereby possibly rendering previous versions of data stale on the failing storage drive 204*b*). Thus, in some embodiments, I/O may be split between the spare storage drive 204*e* and the failing storage drive 204*b* before the spare storage drive 204*e* is fully populated with data and incorporated into the RAID 5 array. This may take stress off the failing storage drive 204*b* to extend its life and reduce the chance that it will suffer a complete failure before all data has been copied therefrom. When the spare storage drive 204*e* is fully populated or substantially populated with data from the failing storage drive 204*b*, the failing storage drive 204*b* may be removed from the RAID 5 array and replaced with the spare storage drive 204*e*.

The disclosed smart rebuild methodology is not limited to the RAID level shown (i.e., a RAID 5 array) or number of storage drives 204 in the RAID, but may be used with other RAID levels and other numbers of storage drives 204. The smart rebuild methodology advantageously allows a RAID to be rebuilt in a way that reduces stress on other storage drives 204 in the RAID, thereby reducing the chance that another storage drive 204 will fail during the rebuild process and result in permanent data loss. The smart RAID rebuild process shown in FIGS. 6 through 11, for example, places most of the RAID rebuild stress on the failing storage drive 204b and spare storage drive 204e, with very little additional stress on the other storage drives 204a, 204c, 204d.

Although the systems and methods disclosed herein have been discussed primarily in association with storage drives 204 configured in a RAID 300, the systems and methods may be applied to other types of storage configurations. For example, solid state drives 204 may include a RAID or similar controller to stripe or mirror data across memory modules or chips within the drive 204. The systems and methods disclosed herein may be applied to such solid state drives 204 to anticipate memory module failures within the drives 204 and thereby prevent data loss. The systems and methods may also be applied to memory managers or storage virtualization products that provide RAID-like redundancy/performance on different types of storage media. Furthermore, although a data loss prevention module 304 in accordance with the invention is shown in a storage controller 200 (See FIG. 3), the data loss prevention module 304 is not limited to implementation in a storage controller 200, but may be implemented all or in part in a host system 106, at the RAID adapter level, within a storage drive 204, or the like.

The flowcharts and block diagrams in the Figures illustrate the architecture, functionality, and operation of possible implementations of systems, methods, and computer-usable media according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for preventing data loss in RAIDs, the method comprising:
monitoring the age of storage drives making up a RAID;
when a storage drive in the RAID reaches a specified age, individually testing the storage drive by subjecting the storage drive to a stress workload test, wherein the stress workload test places additional I/O workload stress on the storage drive while simultaneously refraining from adding I/O workload stress to other storage drives making up the RAID;
determining whether the storage drive passed or failed the stress workload test; and
in the event the storage drive failed the stress workload test, replacing the storage drive with a spare storage drive and rebuilding the RAID.

2. The method of claim 1, wherein monitoring the age of the storage drives comprises monitoring the age relative to a life expectancy published by a vendor of the storage drives.

3. The method of claim 1, wherein testing the storage drive comprises placing the storage drive in a RAID 1 configuration with a spare storage drive.

4. The method of claim 1, further comprising testing the storage drive with greater frequency as the age of the storage drive increases.

5. The method of claim 1, wherein subjecting the storage drive to the stress workload test comprises reading data from the storage drive.

6. The method of claim 1, wherein rebuilding the RAID comprises reducing I/O workload stress on other storage drives in the RAID during the rebuild process.

7. A computer program product for preventing data loss in RAIDs, the computer program product comprising a non-transitory computer-readable medium having computer-usable program code embodied therein, the computer-usable program code comprising:
computer-usable program code to monitor the age of storage drives making up a RAID;
computer-usable program code to, when a storage drive in the RAID reaches a specified age, individually test the storage drive by subjecting the storage drive to a stress workload test, wherein the stress workload test places additional I/O workload stress on the storage drive while simultaneously refraining from adding I/O workload stress to other storage drives making up the RAID;
computer-usable program code to determine whether the storage drive passed or failed the stress workload test; and
computer-usable program code to, in the event the storage drive failed the stress workload test, replace the storage drive with a spare storage drive and rebuild the RAID.

8. The computer program product of claim 7, wherein monitoring the age of the storage drives comprises monitoring the age relative to a life expectancy published by a vendor of the storage drives.

9. The computer program product of claim 7, wherein testing the storage drive comprises placing the storage drive in a RAID 1 configuration with a spare storage drive.

10. The computer program product of claim 7, further comprising computer-usable program code to test the storage drive with greater frequency as the age of the storage drive increases.

11. The computer program product of claim 7, wherein subjecting the storage drive to the stress workload test comprises reading data from the storage drive.

12. The computer program product of claim 7, wherein rebuilding the RAID comprises reducing I/O workload stress on other storage drives in the RAID during the rebuild process.

13. A system for preventing data loss in RAIDs, the system comprising:
at least one processor;
a memory coupled to the at least one processor and storing instructions for execution on the at least one processor, the instructions causing the at least one processor to;
monitor the age of storage drives making up a RAID;
when a storage drive in the RAID reaches a specified age, individually test the storage drive by subjecting the storage drive to a stress workload test, wherein the stress workload test places additional I/O workload stress on the storage drive while simultaneously refraining from adding I/O workload stress on other storage drives making up the RAID;

determine whether the storage drive passed or failed the stress workload test; and in the event the storage drive failed the stress workload test, replace the storage drive with a spare storage drive and rebuild the RAID.

14. The system of claim 13, wherein monitoring the age of the storage drives comprises monitoring the age relative to a life expectancy published by a vendor of the storage drives.

15. The system of claim 13, wherein testing the storage drive comprises placing the storage drive in a RAID 1 configuration with a spare storage drive.

16. The system of claim 13, wherein the instructions further cause the at least one processor to test the storage drive with greater frequency as the age of the storage drive increases.

17. The system of claim 13, wherein rebuilding the RAID comprises reducing I/O workload stress on other storage drives in the RAID during the rebuild process.

* * * * *